United States Patent [19]
McClintock et al.

[11] Patent Number: 5,999,016
[45] Date of Patent: Dec. 7, 1999

[54] ARCHITECTURES FOR PROGRAMMABLE LOGIC DEVICES

[75] Inventors: Cameron McClintock, Mountain View; Ninh Ngo, San Jose; Risa Altaf, Mountain View; Richard G. Cliff, Milpitas, all of Calif.

[73] Assignee: Altera Corporation, San Jose, Calif.

[21] Appl. No.: 08/920,298

[22] Filed: Aug. 28, 1997

Related U.S. Application Data

[60] Provisional application No. 60/028,207, Oct. 10, 1996.

[51] Int. Cl.$^6$ .............................................. H03K 19/177
[52] U.S. Cl. ............................................. 326/41; 326/39
[58] Field of Search .................................. 326/37–41, 47

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | . |
| 4,642,487 | 2/1987 | Carter | . |
| 4,677,318 | 6/1987 | Veenstra | . |
| 4,713,792 | 12/1987 | Hartmann et al. | 364/900 |
| 4,758,745 | 7/1988 | Elgamal et al. | . |
| 4,774,421 | 9/1988 | Hartmann et al. | . |
| 4,871,930 | 10/1989 | Wong et al. | . |
| 4,899,067 | 2/1990 | So et al. | . |
| 4,912,342 | 3/1990 | Wong et al. | . |
| 5,023,606 | 6/1991 | Kaplinsky | 340/825.8 |

(List continued on next page.)

FOREIGN PATENT DOCUMENTS

| | | |
|---|---|---|
| 463746 A2 | 1/1992 | European Pat. Off. . |
| 630115 A2 | 12/1994 | European Pat. Off. . |
| 2295738 | 6/1996 | United Kingdom . |
| 2300947 | 11/1996 | United Kingdom . |
| WO 95/04404 | 2/1995 | WIPO . |
| WO 95/22205 | 8/1995 | WIPO . |
| WO 95/28769 | 10/1995 | WIPO . |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook*, Apr. 1992, Actel Corporation, Sunnyvale, CA, pp. 1–35 through 1–44.

*The Programmable Logic Data Book*, 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

*Primary Examiner*—Jon Santamauro
*Attorney, Agent, or Firm*—Fish & Neave; Robert R. Jackson; Steven J. Cahill

[57] ABSTRACT

A programmable logic device has a plurality of super-regions of programmable logic disposed on the device in a two-dimensional array of intersecting rows and columns of super-regions. Each super-region may be like a small or moderately sized programmable logic device and may include a two-dimensional array of intersecting rows and columns of regions of programmable logic. Each region may in turn include a plurality of subregions of programmable logic. Horizontal and vertical inter-super-region interconnection conductors are associated with the rows and columns of super-regions. These conductors are selectively connectable to horizontal and vertical inter-region interconnection conductors in the super-regions.

18 Claims, 9 Drawing Sheets

U.S. PATENT DOCUMENTS

| | | |
|---|---|---|
| 5,073,729 | 12/1991 | Greene et al. . |
| 5,121,006 | 6/1992 | Pedersen . |
| 5,122,685 | 6/1992 | Chan et al. . |
| 5,132,571 | 7/1992 | McCollum et al. . |
| 5,144,166 | 9/1992 | Camarota et al. . |
| 5,208,491 | 5/1993 | Ebeling et al. . |
| 5,218,240 | 6/1993 | Camarota . |
| 5,220,214 | 6/1993 | Pedersen . |
| 5,225,719 | 7/1993 | Agrawal et al. . |
| 5,255,203 | 10/1993 | Agrawal ................... 364/489 |
| 5,258,668 | 11/1993 | Cliff et al. . |
| 5,260,610 | 11/1993 | Pedersen et al. . |
| 5,260,611 | 11/1993 | Cliff et al. . |
| 5,274,581 | 12/1993 | Cliff et al. ................. 364/784 |
| 5,338,984 | 8/1994 | Sutherland . |
| 5,350,954 | 9/1994 | Patel . |
| 5,371,422 | 12/1994 | Patel et al. ................. 326/41 |
| 5,448,186 | 9/1995 | Kawata ....................... 326/41 |
| 5,455,525 | 10/1995 | Ho et al. ..................... 326/41 |
| 5,457,410 | 10/1995 | Ting ............................ 326/41 |
| 5,467,029 | 11/1995 | Taffe ........................... 326/41 |
| 5,469,003 | 11/1995 | Kean ........................... 326/39 |
| 5,483,178 | 1/1996 | Costello et al. ............. 326/41 |
| 5,509,128 | 4/1996 | Chan ........................... 395/311 |
| 5,541,530 | 7/1996 | Cliff et al. ................... 326/41 |

ARCHITECTURES FOR PROGRAMMABLE LOGIC DEVICES

This application claims the benefit of provisional application No. 60/028,207, filed Oct. 10, 1996.

BACKGROUND OF THE INVENTION

This invention relates to programmable logic devices, and more particularly to the manner in which the regions of programmable logic on such devices are organized and interconnected.

Many current programmable logic integrated circuit devices have a plurality of regions of programmable logic disposed on the device in a two-dimensional array of intersecting rows and columns of such regions. Examples of such devices are shown in Pedersen et al. U.S. Pat. No. 5,260,610, Cliff et al. U.S. Pat. No. 5,260,611, Cliff et al. U.S. patent application Ser. No. 08/442,795, filed May 17, 1995, and Cliff et al. U.S. patent application Ser. No. 08/672,676, filed Jun. 28, 1996, all of which are hereby incorporated by reference herein. In such devices horizontal interconnection conductors may be associated with each row of regions for conveying signals to, from, and between the regions in that row. Vertical interconnection connection conductors may be associated with each column of regions for conveying signals to, from, and between the rows.

There are demands for programmable logic devices with more and more programmable logic regions. It may not be desirable, however, to provide more logic regions by simply increasing the number of logic regions in each row and/or increasing the number of rows. This is so because this expedient increases the number of programmable connections to and/or from the horizontal and/or vertical conductors. The loading on these conductors may therefore become undesirably large and signal propagation speed along them undesirably slow. The large number of programmable connections to the horizontal and/or vertical conductors also requires a correspondingly large number of programmable memory elements for controlling those connections. These numerous programmable connections and associated memory elements may result in an inefficient use of silicon area.

In view of the foregoing, it is an object of this invention to provide improved organizations for the logic regions and interconnection conductors of programmable logic devices.

It is a more particular object of this invention to provide organizations for programmable logic devices which allow the number of regions on the device to be greatly increased without excessively increasing the loading on any one type of interconnection conductor.

SUMMARY OF THE INVENTION

These and other objects of the invention are accomplished in accordance with the principles of the invention by providing programmable logic devices in which the regions of programmable logic are grouped into a plurality of super-regions. The super-regions may be disposed on the device in a two-dimensional array of intersecting rows and columns of super-regions. Each super-region may have an organization similar to a small or moderately sized programmable logic device of known construction. Thus the regions in each super-region may be arrayed in a two-dimensional array of intersecting rows and columns of regions, with horizontal inter-region interconnection conductors associated with each row of regions and vertical inter-region interconnection conductors associated with each column of regions. Each region may in turn include a plurality of subregions of programmable logic for performing any one of a plurality of relatively elementary logic functions on input signals to the subregion to produce an output signal of the subregion.

Programmable logic connectors may be associated with each region for selectively bringing signals into the region (for use as subregion inputs) from the horizontal and/or vertical inter-region conductors associated with the region. Other programmable logic connectors may be associated with each region for selectively feeding subregion outputs of the region back to subregion inputs of the region, and for selectively applying subregion outputs of the region to the horizontal and/or vertical inter-region conductors associated with the region. Still other programmable logic connectors may be associated with each region for selectively interconnecting inter-region conductors associated with the region. This organization of the super-regions is only illustrative, and other organizations may be used instead if desired.

A plurality of horizontal inter-super-region interconnection conductors is associated with each row of super-regions for conveying signals to, from, and between the super-regions in the associated row. A plurality of vertical inter-super-region interconnection conductors is associated with each column of super-regions for conveying signals to, from, and between the super-regions in the associated column. Each super-region has programmable inputs from and outputs to the horizontal and vertical inter-super-region conductors associated with the row and column that include that super-region. These super-region inputs and outputs are preferably provided via programmable logic connectors and at schematic locations in the super-region organization that would be typical for the super-region to input and output if the super-region were a separate programmable logic device. Additional programmable logic connectors are provided for selectively interconnecting intersecting horizontal and vertical inter-super-region interconnection conductors.

From the foregoing it will be seen that the inter-super-region conductors constitute another hierarchical level in the interconnection structure of devices constructed in accordance with this invention. Within each super-region the number of programmable connections to and/or from each inter-region conductor can be kept relatively small, thereby preventing excessive loading of and slow signal propagation by those conductors. The same is true for the inter-super-region conductors, which have programmable connections only at the super-region level, and not at the level of the much more numerous individual regions. Loading of the inter-super-region conductors is therefore kept relatively small or moderate, so that again signal propagation is not unduly slowed. The structures of this invention lend themselves to provision of the inter-super-region conductors in additional layers of metal, which are now becoming possible with current semiconductor fabrication technology. In this and other ways the structures of this invention facilitate more efficient use of silicon area.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
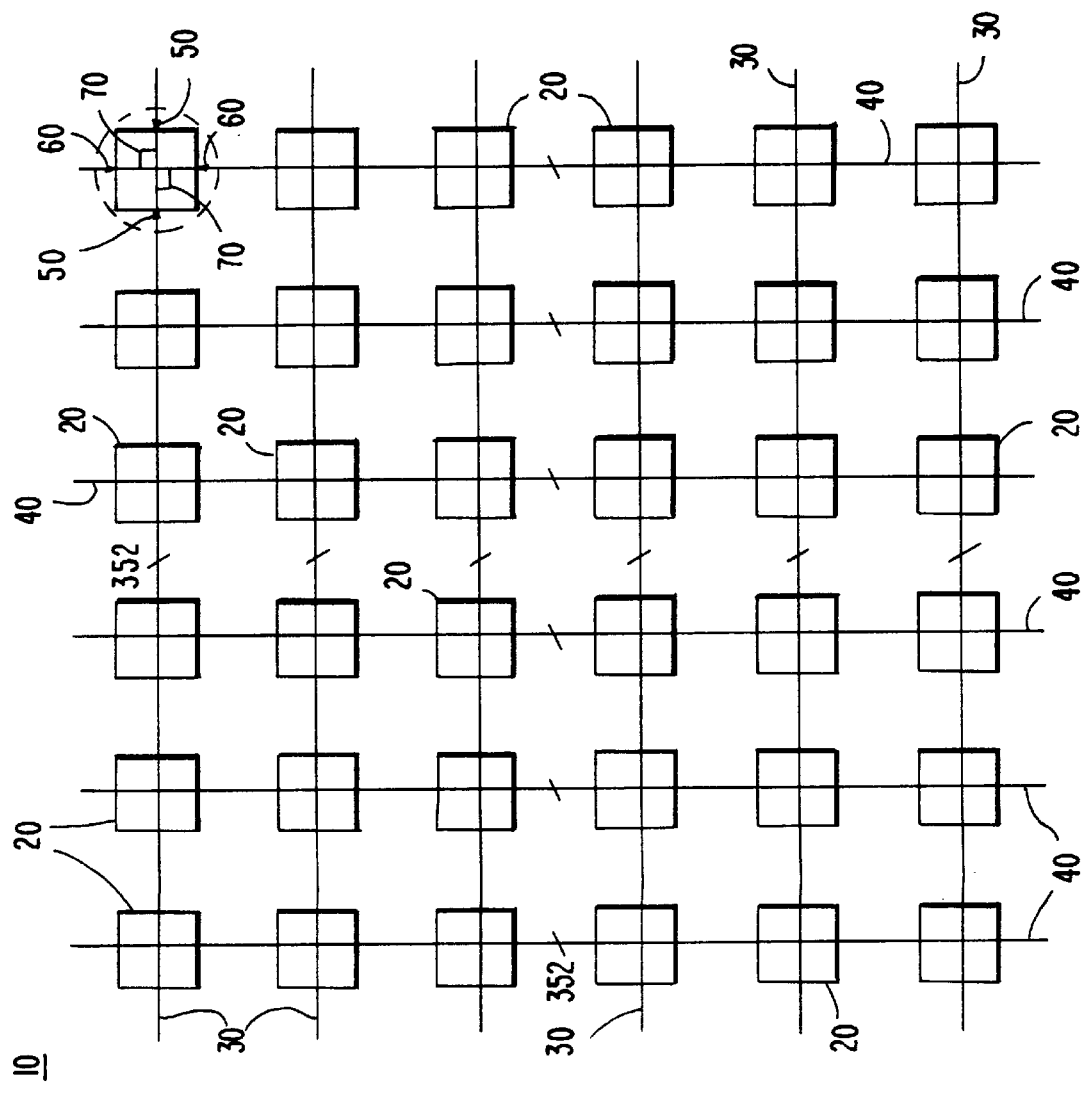
FIG. 1 is a simplified schematic block diagram of an illustrative embodiment of a programmable logic device constructed in accordance with the invention.

The illustrative programmable logic device 10 shown in FIG. 1 includes a plurality of super-regions 20 of programmable logic disposed on the device in a two-dimensional array of intersecting rows and columns of such super-regions. In particular, there are six rows and six columns of super-regions 20 on device 10. A plurality of horizontal inter-super-region interconnection conductors 30 is associated with each row of super-regions 20. A plurality of vertical inter-super-region interconnection conductors 40 is associated with each column of super-regions 20. For example, there may be 352 conductors 30 associated with each row and 352 conductors 40 associated with each column of super-regions 20. The conductors 30 associated with each row of super-regions 20 are selectively usable to convey signals to, from, and between the super-regions in that row. The conductors 40 associated with each column of super-regions 20 are selectively usable to convey signals to, from, and between the super-regions in that column.

If desired, some or all of conductors 30 or 40 may be segmented rather than extending continuously along the entire length of the associated row or column of super-regions 20. For example, some or all of conductors 30 may have left and right halves which are each independently usable but which can be interconnected by PLCs when longer conductors are required. Similarly, some or all of conductors 40 may have top and bottom halves which are each independently usable or which can be interconnected by PLCs. Suitable segmented conductor structures and programmable interconnections are shown, for example, in Reddy et al. U.S. patent application Ser. No. 08/855,192, filed May 13, 1997, which is hereby incorporated by reference herein in its entirety.

Programmable logic connectors ("PLCs") 50 are associated with each super-region 20 for selectively making connections between that super-region and the conductors 30 associated with the row that includes that super-region. PLCs 60 are associated with each super-region 20 for selectively making connections between that super-region and the conductors 40 associated with the column that includes that super-region. PLCs 70 are associated with each super-region 20 for selectively making connections between the conductors 30 and 40 that intersect in the vicinity of that super-region. Elements 50, 60, and 70 are only shown for one representative super-region 20 in FIG. 1, but it will be understood that similar resources are provided for all super-regions in device 10.

Figure 2:
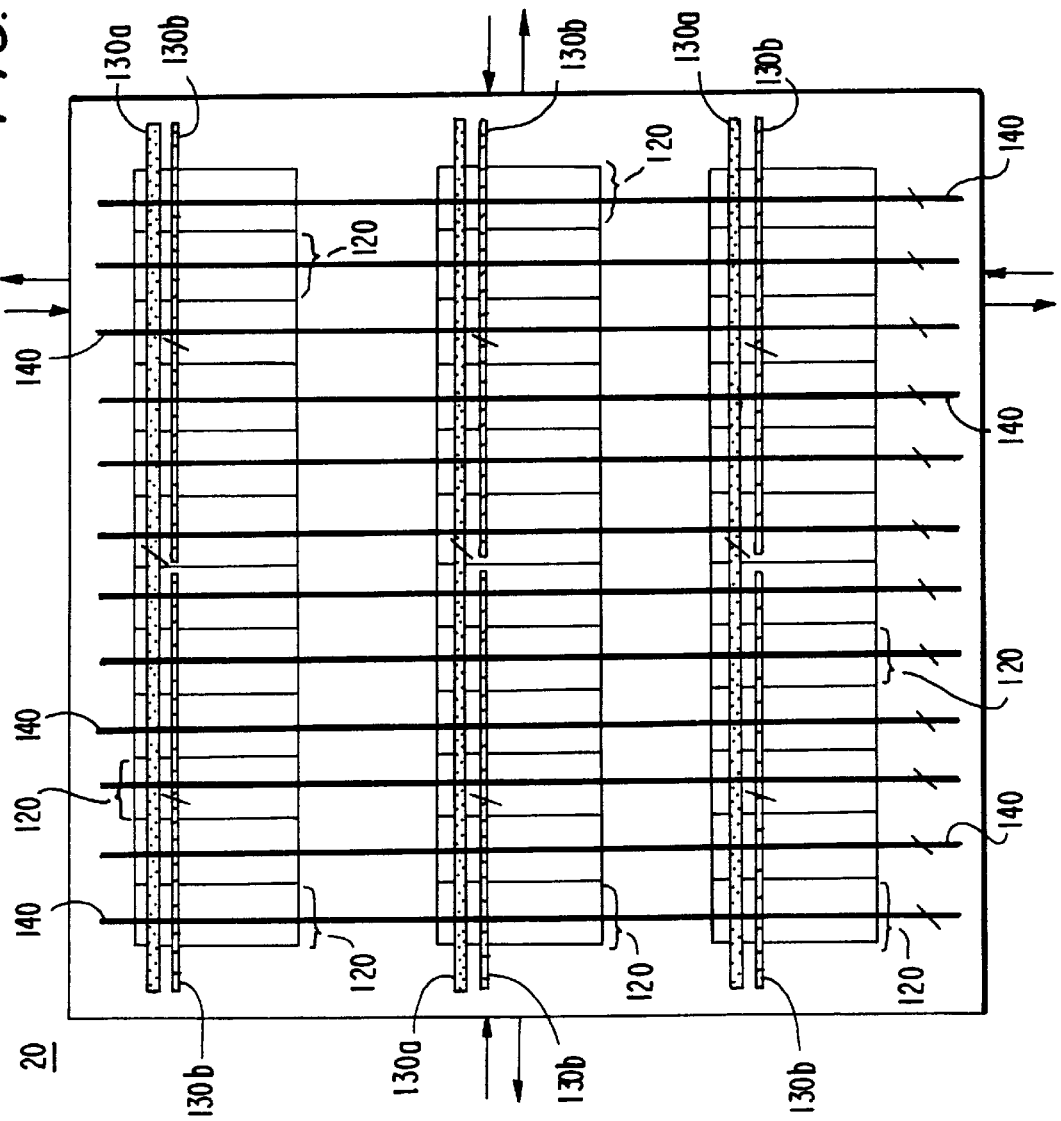
FIG. 2 is a more detailed but still simplified schematic block diagram of an illustrative embodiment of a representative portion of the device shown in FIG. 1 in accordance with the invention.

An illustrative embodiment of a representative super-region 20 is shown in more detail in FIG. 2. In this embodiment each super-region 20 is constructed somewhat like a relatively small programmable logic device of the type shown in Cliff et al. U.S. patent application Ser. No. 08/442,795, filed May 17, 1995, or Cliff et al. U.S. patent application Ser. No. 08/672,676, filed Jun. 28, 1996. It will be understood that these types of super-region constructions are only illustrative, and that any other suitable construction can be used instead if desired. For example, other suitable constructions are shown in Pedersen et al. U.S. Pat. No. 5,260,610 and Cliff et al. U.S. Pat. No. 5,260,611, both of which are hereby incorporated by reference herein in their entireties.

The illustrative super-region 20 shown in FIG. 2 includes a plurality of regions 120 of programmable logic disposed within the super-region in a two-dimensional array of intersecting rows and columns of regions 120. In particular, super-region 20 includes three rows and 12 columns of regions 120. A plurality of full horizontal inter-region interconnection conductors 130a is associated with each row of regions 120 for selectively conveying signals to, from, and between the regions 120 in the associated row. For example, there may be 66 conductors 130a associated with each row of regions 120. Conductors 130a are called "full" horizontal conductors because they extend the full length of the associated row of regions 120. A plurality of half horizontal interregion interconnection conductors 130b is associated with each left or right half row of regions 120 for selectively conveying signals to, from, and between the regions 120 in the associated half row. For example, there may be 64 conductors 130b associated with each half of each row of regions 120. Conductors 130b are called "half" horizontal conductors because they extend half the length of the associated row of regions 120. A plurality of vertical inter-row or inter-region interconnection conductors 140 is associated with each column of regions 120 for selectively conveying signals to, from, and between the rows or the regions 120 in the associated column of regions. For example, there may be 16 conductors 140 associated with each column of regions 120. For completeness FIG. 2 also indicates by arrows the PLCs 50 and 60 that were mentioned earlier in connection with FIG. 1.

Whereas FIG. 2 shows an embodiment in which each super-region 20 includes three rows and 12 columns of regions 120, it will be understood that greater or lesser numbers of rows and columns can be provided if desired. For example, each super-region 20 may include only one row of regions 120, in which case it is not necessary to provide vertical conductors 140.

Figure 3:
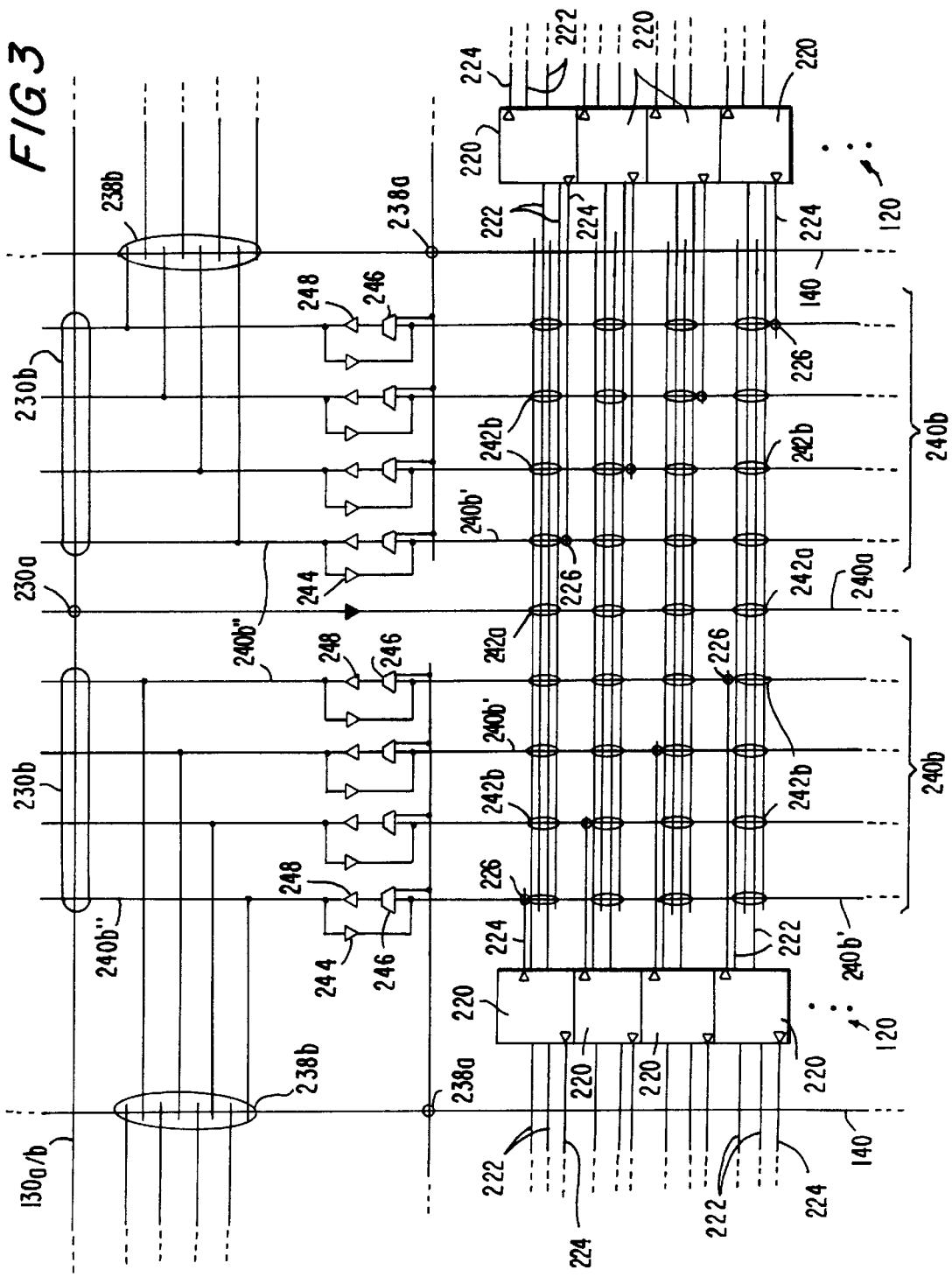
FIG. 3 is a more detailed but still simplified schematic block diagram of an illustrative embodiment of a representative portion of the FIG. 2 apparatus in accordance with the invention.

FIG. 3 shows an illustrative embodiment of a representative portion of the FIG. 2 apparatus in still more detail. This embodiment is similar to the structure shown in above-mentioned Cliff et al. U.S. patent application Ser. No. 08/672,676. It will be understood, however, that many other structures can be used instead if desired. For example, another possible structure is shown in above-mentioned Cliff et al. U.S. patent application Ser. No. 08/442,795, and still other possible structures are shown in above-mentioned Pedersen et al. U.S. Pat. No. 5,260,610 and Cliff et al. U.S. Pat. No. 5,260,611.

FIG. 3 shows that each region 120 includes a plurality of subregions 220 of programmable logic. FIG. 3 shows four representative subregions 220 of each depicted region 120, but it will be understood that each region may include more than four subregions (e.g., eight, ten, or 16 subregions). Each subregion 220 is programmable to perform any one of several logic functions on input signals 222 applied to the subregion. For example, each subregion 220 may include a four-input look-up table which is programmable to produce a look-up table output signal which is any logical combination of four inputs to the look-up table. Each subregion 220 may further include a register and associated programmable switches for selectively registering the output signal of the look-up table. Either output signal 224 of the subregion may be either the registered or unregistered look-up table output signal. Examples of suitable subregion structures are shown in the Cliff et al. references mentioned in the preceding paragraph. It will be understood, however, that other subregion structures may be used instead if desired. For example, subregion structures that perform sum-of-products logic, rather than look-up table logic may be used.

A plurality of local conductors 240 is provided between each horizontally adjacent pair of regions 120. Conductors 240 are of two types: 240a and 240b. Conductors 240a are unsegmented and are used only for bringing signals into the adjacent regions 120 from the inter-region interconnection conductors 130a and 130b that are associated with the row that includes those regions. PLCs 230a are provided for selectively connecting conductors 130 to conductors 240a, and PLCs 242a are provided for selectively connecting conductors 240a to subregion input conductors 222.

Conductors 240b, on the other hand, are segmented and may be used for a variety of purposes. The lower segment of each conductor 240b is designated 240b'. The upper segment of each conductor 240b is designated 240b". The upper and lower segments of each conductor 240b may be used either together or separately. For example, if both segments are used together, a signal may be brought into the adjacent regions 120 from either a horizontal conductor 130 or a vertical conductor 140 adjacent to those regions. The path from a horizontal conductor 130 is via a PLC 230b to upper segment 240b", then via a tri-state driver 244 to lower segment 240b', then via a PLC 242b to a subregion input conductor 222. The path from a vertical conductor 140 is via a PLC 238b to upper segment 240b", then as described in the preceding sentence to a subregion input conductor 222. Another possible use of segments 240b' and 240b" together is to apply subregion output signals 224 to horizontal and/or vertical conductors 130 and/or 140. The path from a subregion output 224 to a horizontal conductor 130 is via a PLC 226 to a lower segment 240b', then through a PLC 246 and a tri-state driver 248 to an upper segment 240b", then via a PLC 230b to a horizontal conductor 130. The path to a vertical conductor 140 is similar except that the final connection is made via a PLC 238b. Still another possible use of just a lower segment 240b' by itself is as a local feedback conductor for the subregion output 224 that is connectable to that segment 240b'. A subregion output signal on such a lower segment 240b' can be applied as an input to any of the subregions 220 in the region 120 that originated that signal or in a region 120 that is horizontally adjacent to the originating region. This is so because horizontally adjacent regions 120 effectively share the conductors 240 that are between them. A final possible use of just an upper segment 240b" by itself is to apply a signal on a vertical conductor 140 to a horizontal conductor 130. The route for such a connection is via a PLC 238a, a PLC 246, a tri-state driver 248, an upper segment 240b", and a PLC 230b.

The various PLC groups shown in FIG. 3 may be fully populated or only partly populated, as desired. For example, PLCs 242a and 242b may be fully populated so that every conductor 240 is connectable to any conductor 222. On the other hand, PLC groups 230a, 230b, 238a, and 238b may be only partly populated. However, the population densities and distributions of the programmable connections that are provided are preferably such that, for example, each conductor 130 and 140 has several ways into each adjacent region 120, each vertical conductor 140 has several ways to connect to horizontal conductors 130 in each row, and each subregion output 224 has several ways to connect to adjacent horizontal and/or vertical conductors 130 and/or 140.

The conductors 240 shown in FIG. 3 are only representative. More such conductors of both types 240a and 240b may be provided between horizontally adjacent regions 120 as desired.

Figure 4:
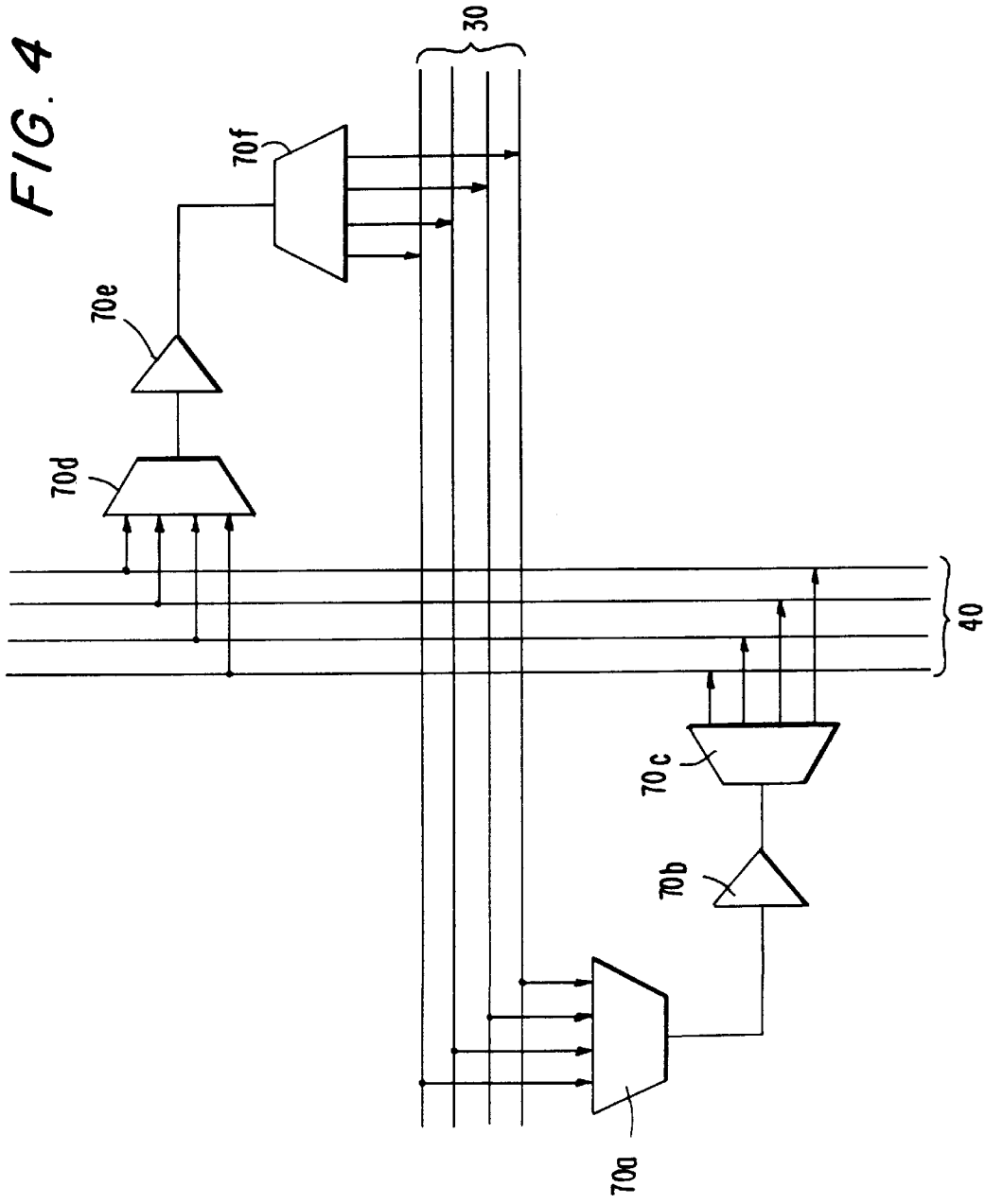
FIG. 4 is a more detailed but still simplified schematic block diagram of an illustrative embodiment of another representative portion of the device shown in FIG. 1.

FIG. 4 shows an illustrative implementation of representative PLCs 70 in FIG. 1. In this embodiment the horizontal inter-super-region interconnection conductors 30 associated with each row of super-regions 20 are grouped in groups of four conductors. Similarly, the vertical inter-super-region interconnection conductors 40 associated with each column of super-regions 20 are grouped in groups of four conductors. Adjacent to each super-region 20 the adjacent horizontal conductors 30 are connected to PLC input stages 70a. In particular, each group of four horizontal conductors 30 is associated with a respective PLC input stage 70a, with each of the conductors in that group being connected to a respective input terminal of the associated PLC input stage. Each PLC input stage 70a may be a multiplexer for programmably selecting one of its inputs as its output. The output signal of each PLC input stage 70a is applied to a respective driver 70b. The output signal of each driver 70b is applied to the input of a respective PLC output stage 70c (e.g., a de-multiplexer for programmably applying its input signal to one of its four output leads). Each PLC output stage 70c is associated with a respective one of the groups of four vertical conductors 40 that are adjacent to the super-region 20 that the associated input stage 70a is adjacent to. Each output lead of each PLC output stage 70c is connected to a respective one of the conductors 40 in the associated group of four such conductors.

From the foregoing, it will be seen that the signal on any one of the four horizontal conductors 30 in the group associated with input stage 70a can be applied to any one of the four vertical conductors associated with output stage 70c. In effect, each driver 70b is shared by four adjacent conductors 30 and four adjacent conductors 40.

Elements 70d, 70e, and 70f are respectively similar to elements 70a, 70b, and 70c and allow the signal on any one of the four vertical conductors 40 in the group associated with PLC input stage 70d to be applied via driver 70e to any one of the horizontal conductors 30 in the group associated with PLC output stage 70f.

Assuming that there are 352 conductors 30 associated with each row of super-regions 20 and 352 conductors 40 associated with each column of super-regions 20, the structure shown in FIG. 4 is repeated 88 times adjacent to each super-region 20.

It will be understood that the implementation of PLCs 70 shown in FIG. 4 is only illustrative and that PLCs 70 may be implemented in other ways if desired. For example, smaller or larger input and output stages 70a, 70c, 70d, and 70f may be used so that drivers 70b and 70e are shared by smaller or larger numbers of conductors 30 and 40 rather than by four of each type of these conductors as is shown in FIG. 4.

Figure 5:
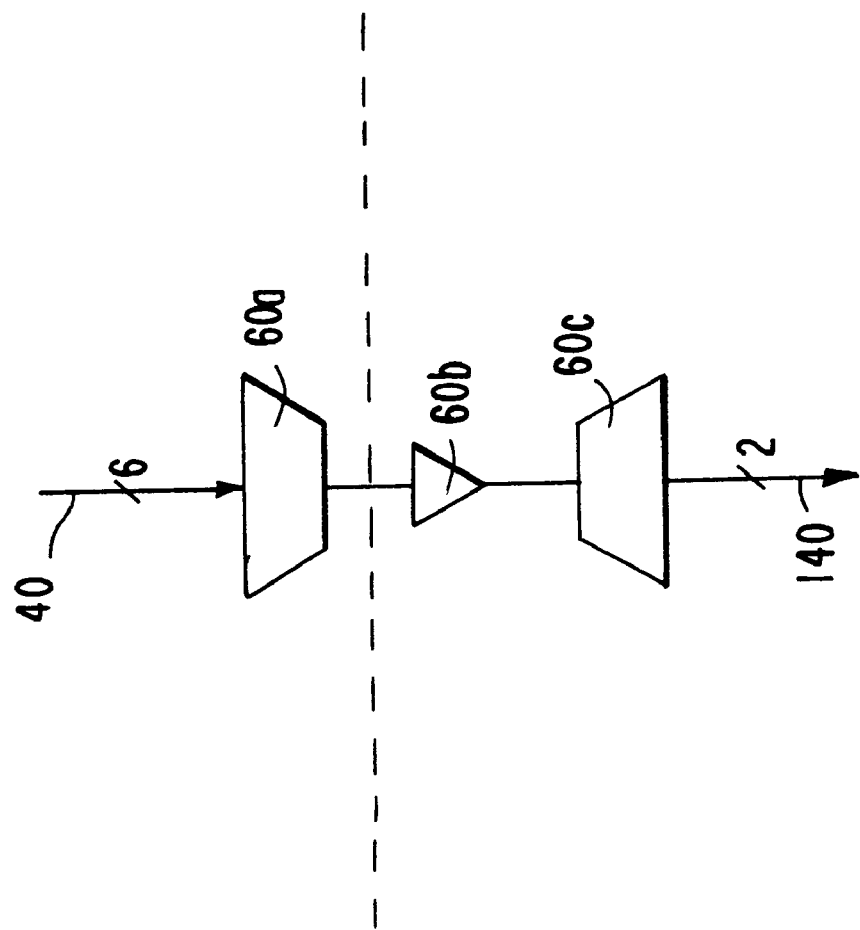
FIG. 5 is a more detailed but still simplified schematic block diagram of an illustrative embodiment of still another representative portion of the device shown in FIG. 1.

FIG. 5 shows an illustrative implementation of representative PLCs 60 in FIG. 1. FIG. 5 shows a PLC for applying a signal on one of six vertical conductors 40 adjacent to a representative super-region 20 to one of two vertical conductors 140 of the super-region. Assuming that there are 352 conductors 40 associated with each column of super-regions 20, the structure shown in FIG. 5 may be repeated 60 times for each super-region 20 to ensure that each conductor 40 has at least one way into each super-region in the associated column. Of these 60 repetitions, 30 may be adjacent the upper ends of the vertical conductors 140 in the associated super-region, and the other 30 may be adjacent the lower ends of the vertical conductors 140 in that super-region.

Referring specifically to the elements shown in FIG. 5, six conductors 40 are respectively connected to six input terminals of PLC input stage 60a(e.g., a multiplexer for programmably selecting one input signal as an output). The output signal of input stage 60a is applied to driver 60b. The output signal of driver 60b is applied to the input of PLC output stage 60c (e.g., a demultiplexer for programmably applying an input signal to one of its two output leads). From the foregoing it will be seen that the structure shown in FIG. 5 is capable of applying the signal on any one of six conductors 40 to any one of two associated conductors 140. Driver 60b is effectively shared by the associated six input conductors 40 and two output conductors 140.

Again, it will be understood that the implementation of PLCs 60 shown in FIG. 5 is only illustrative and that PLCs 60 may be implemented in other ways if desired. For example, smaller or larger input and output stages 60a and 60c may be used so that drivers 60b are shared by smaller or larger numbers of conductors 40 and 140.

Figure 6:
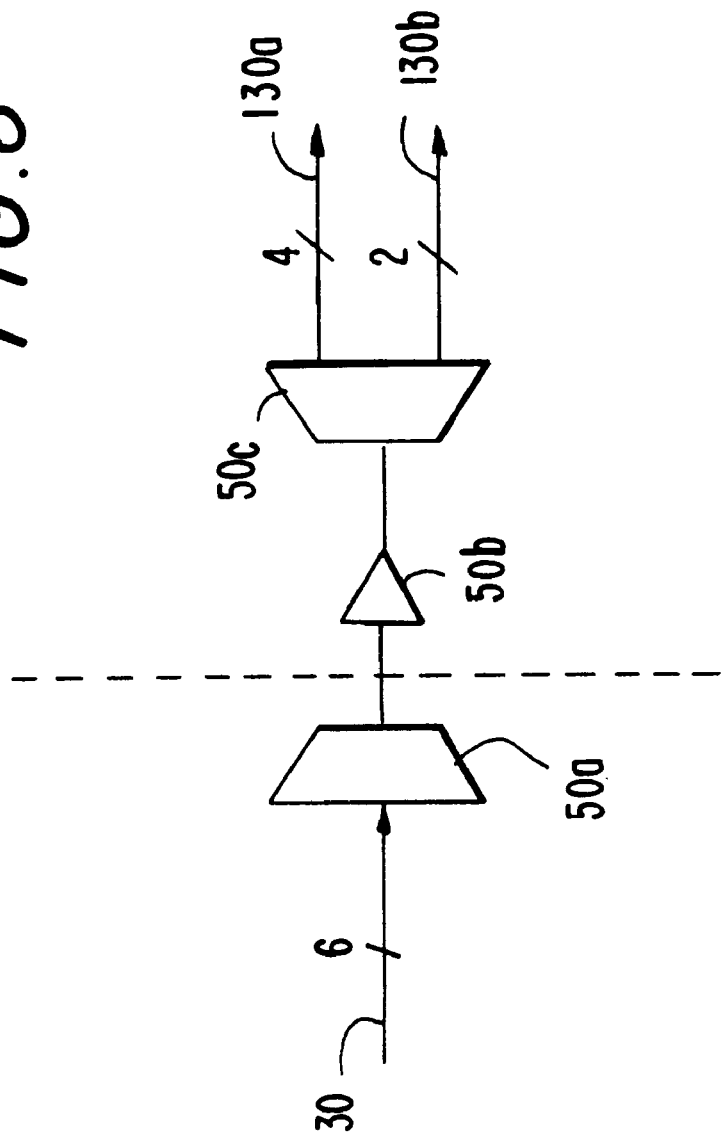
FIG. 6 is a more detailed but still simplified schematic block diagram of an illustrative embodiment of yet another representative portion of the device shown in FIG. 1.

FIG. 6 shows an illustrative implementation of representative PLCs 50 in FIG. 1. FIG. 6 shows a PLC for applying a signal on one of six horizontal conductors 30 adjacent to a representative super-region 20 to one of six horizontal conductors 130 (i.e., four full horizontal conductors 130a and two half horizontal conductors 130b) of the super-region. Assuming that there are 352 conductors 30 associated with each row of super-regions 20, the structure shown in FIG. 6 may be repeated 60 times for each super-region 20 to ensure that each conductor 30 has at least one way into each super-region in the associated row. Of these 60 repetitions, 30 may be adjacent the left-hand ends of the horizontal conductors 130 in the associated super-region, and the other 30 may be adjacent the right-hand ends of the horizontal conductors 130 in that super-region.

Referring specifically to the elements shown in FIG. 6, six conductors 30 are respectively connected to six input terminals of PLC input stage 50a (e.g., a multiplexer for programmably selecting one input signal as an output). The output signal of input stage 50a is applied to driver 50b. The output signal of driver 50b is applied to the input of PLC output stage 50c (e.g., a demultiplexer for programmably applying an input signal to one of its six output leads). From the foregoing it will be seen that the structure shown in FIG. 6 is capable of applying the signal on any one of six conductors 30 to any one of six associated conductors 130. Driver 50b is effectively shared by the associated six input conductors 30 and six output conductors 130.

Once again, it will be understood that the implementation of PLCs 50 shown in FIG. 6 is only illustrative and that PLCs 50 may be implemented in other ways if desired. For example, smaller or larger input and output stages 50a and 50c may be used so that drivers 50b are shared by smaller or larger numbers of conductors 30 and 130.

Figure 7:
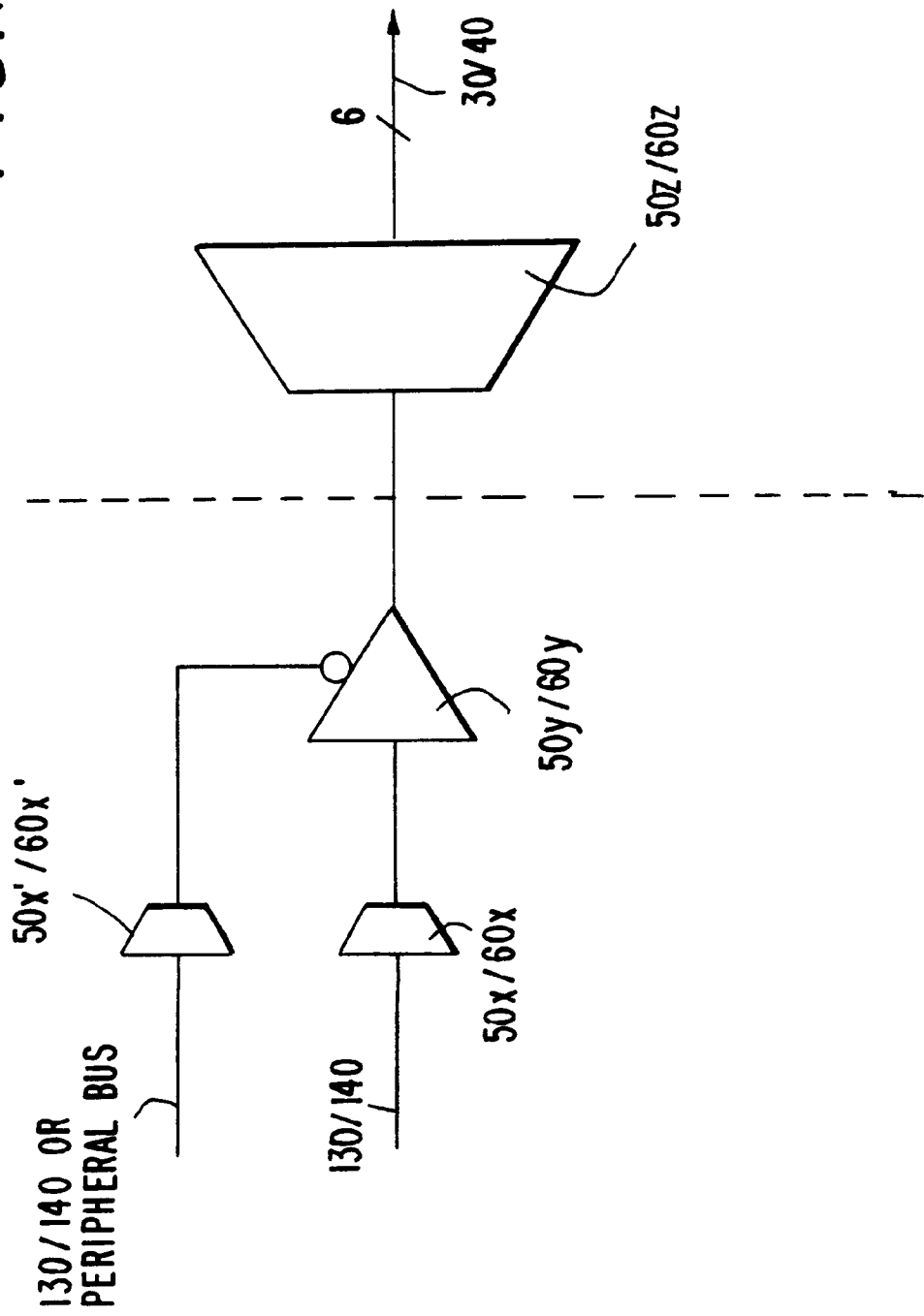
FIG. 7 is a more detailed but still simplified schematic block diagram of an illustrative embodiment of still another representative portion of the device shown in FIG. 1.

Whereas FIGS. 5 and 6 show illustrative embodiments of the portions of PLCs 50 and 60 that drive from conductors 30 and 40 onto conductors 130 and 140, FIG. 7 shows an illustrative embodiment of the portion of PLCs 50 and 60 that drive in the opposite direction (i.e, from conductors 130 and 140 onto conductors 30 and 40). As shown in FIG. 7, PLC input stage 50x or 60x is programmable to select the signal on any one of several conductors 130 or 140 for application to the data input terminal of an associated programmable, tri-state driver 50y or 60y. PLC 50x' or 60x' is programmable to select the signal on any one of several conductors 130 or 140 (or any of several peripheral bus conductors of the super-region) for application to the output enable input terminal of driver 50y or 60y. (Although peripheral bus conductors are not shown specifically herein, they may be like conductors 190 and 212 in FIG. 6 of above-mentioned Cliff et al. U.S. patent application Ser. No. 08/442,795.) The output signal of driver 50y or 60y is applied to the input terminal of PLC output stage 50z or 60z. Output stage 50z or 60z may be a demultiplexer which is programmable to apply its input signal to any one of its six outputs. These outputs are respectively connected to six inter-super-region interconnection conductors 30 or 40 that are adjacent to the row or column that includes the super-region from which the input signal 130 or 140 came.

Assuming that there are 352 conductors 30 or 40 associated with each row or column, the structure shown in FIG. 7 may be repeated 120 times for each super-region 20. Sixty of these repetitions may be for horizontal conductors 30/130, while the other 60 repetitions may be for vertical conductors 40/140. The 60 repetitions for conductors 30/130 may subdivided into 30 repetitions adjacent the left-hand ends of the conductors 130 in the associated super-region, and another 30 repetitions adjacent the right-hand ends of those conductors. Similarly, the 60 repetitions for conductors 40/140 may be subdivided into 30 repetitions adjacent the upper ends of conductors 140 in the associated super-region, and another 30 repetitions adjacent the lower ends of those conductors.

It will be understood that the structure shown in FIG. 7 is only illustrative, and that other structures can be used if desired. For example, the sizes of input stages 50x/60x and output stages 50z/60z can be varied.

Figure 8:
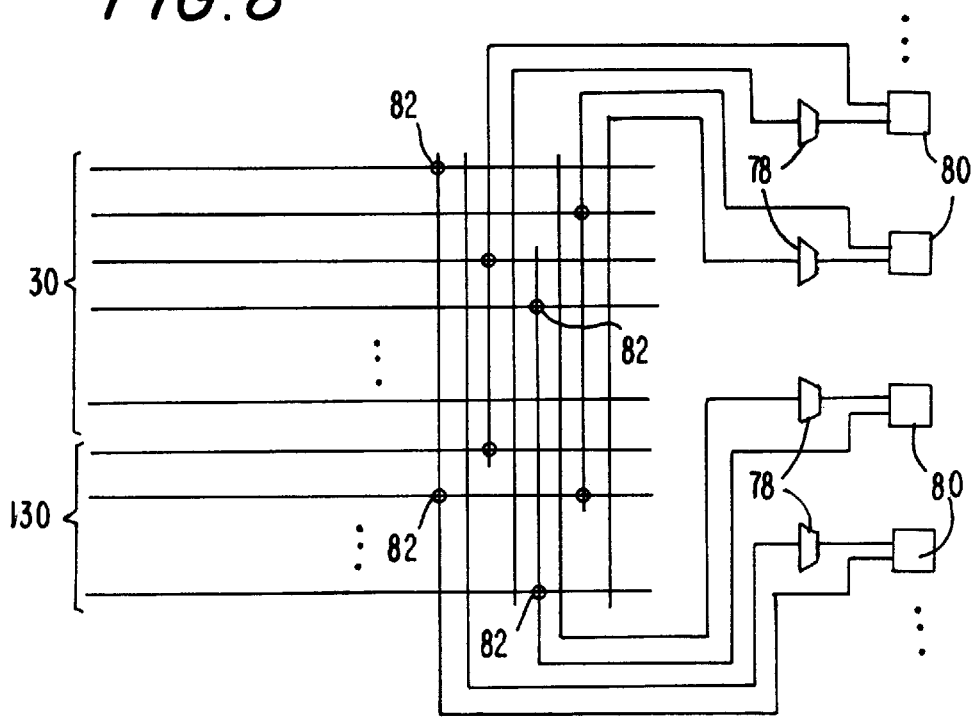
FIG. 8 is a more detailed but still simplified schematic block diagram of an illustrative embodiment of yet another representative portion of the device shown in FIG. 1.
Figure 9:
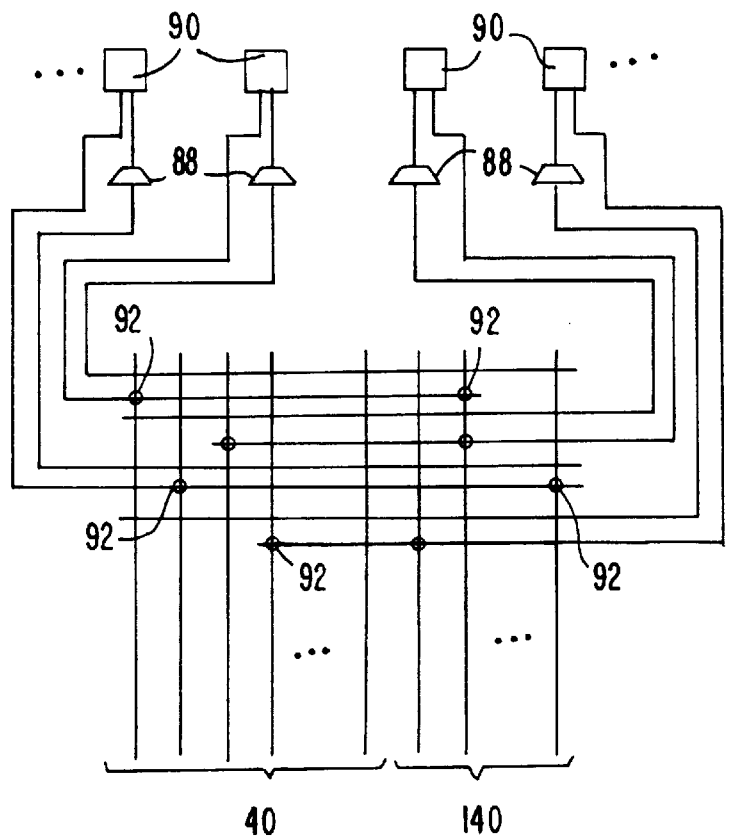
FIG. 9 is a more detailed but still simplified schematic block diagram of an illustrative embodiment of still another representative portion of the device shown in FIG. 1.

FIGS. 8 and 9 show an illustrative embodiment of input/output ("I/O") connections for device 10. I/O pads 80 and 90 are disposed along the periphery of device 10. FIG. 8 shows several representative horizontal I/O pads 80 along the right-hand edge of device 10. Similar horizontal I/O pads 80 may be disposed along the left-hand edge of the device. FIG. 9 shows several representative vertical I/O pads 90 along the top edge of device 10. Similar vertical I/O pads 90 may be disposed along the bottom edge of the device.

Considering first the horizontal I/O pads, at each end of each row of super-regions 20, the horizontal conductors 30 associated with that row are selectively connectable to any of several I/O pads 80 adjacent that end of that row. These connections are made via PLCs 78, each of which is programmable to select any one of the associated conductors 30 as the source of an output signal that is applied to the associated I/O pin 80. Additional inputs to some or all of the PLCs 78 adjacent each end of each row of super-regions 20 may be the horizontal conductors 130 of the super-region at that end of that row. Thus the super-region 20 at each end of each row can have a somewhat higher speed output connection to I/O pads 80 (because these outputs do not have to first pass through a conductor 30 or 40).

For input purposes, each I/O pad 80 is selectively connectable to one or more of the conductors 30 in the associated row via PLCs 82. If desired, additional PLCs 82 may be provided for selectively allowing an input signal from an I/O pad 80 to be applied to one of more of the conductors 130 of the super-region 20 which is at the end of the row adjacent to that I/O pad. This allows somewhat higher speed input to the super-regions 20 at the ends of the rows (because the input signal does not have to first pass through a conductors 30 or 40). PLCs 82 preferably include programmable tri-state drivers to facilitate use of the associated conductors 30/130 for other purposes when they are not being used for inputs from I/O pads 80.

As shown in FIG. 9 the circuitry for vertical I/O pads 90 may be similar to the horizontal I/O pad circuitry shown in FIG. 8 and described above. Thus any of the vertical conductors 40 associated with a column of super-regions can output to any of several vertical I/O pads 90 associated with that column via PLCs 88. Additional inputs to PLCs 88 are the vertical conductors 140 of the super-region 20 at the adjacent end of the associated column. For input purposes, each I/O pad 90 can apply a signal it receives from external circuitry to one or more associated conductors 40 and 140 via PLCs 92. PLCs 92 are preferably similar to above-described PLCs 82.

Figure 10:
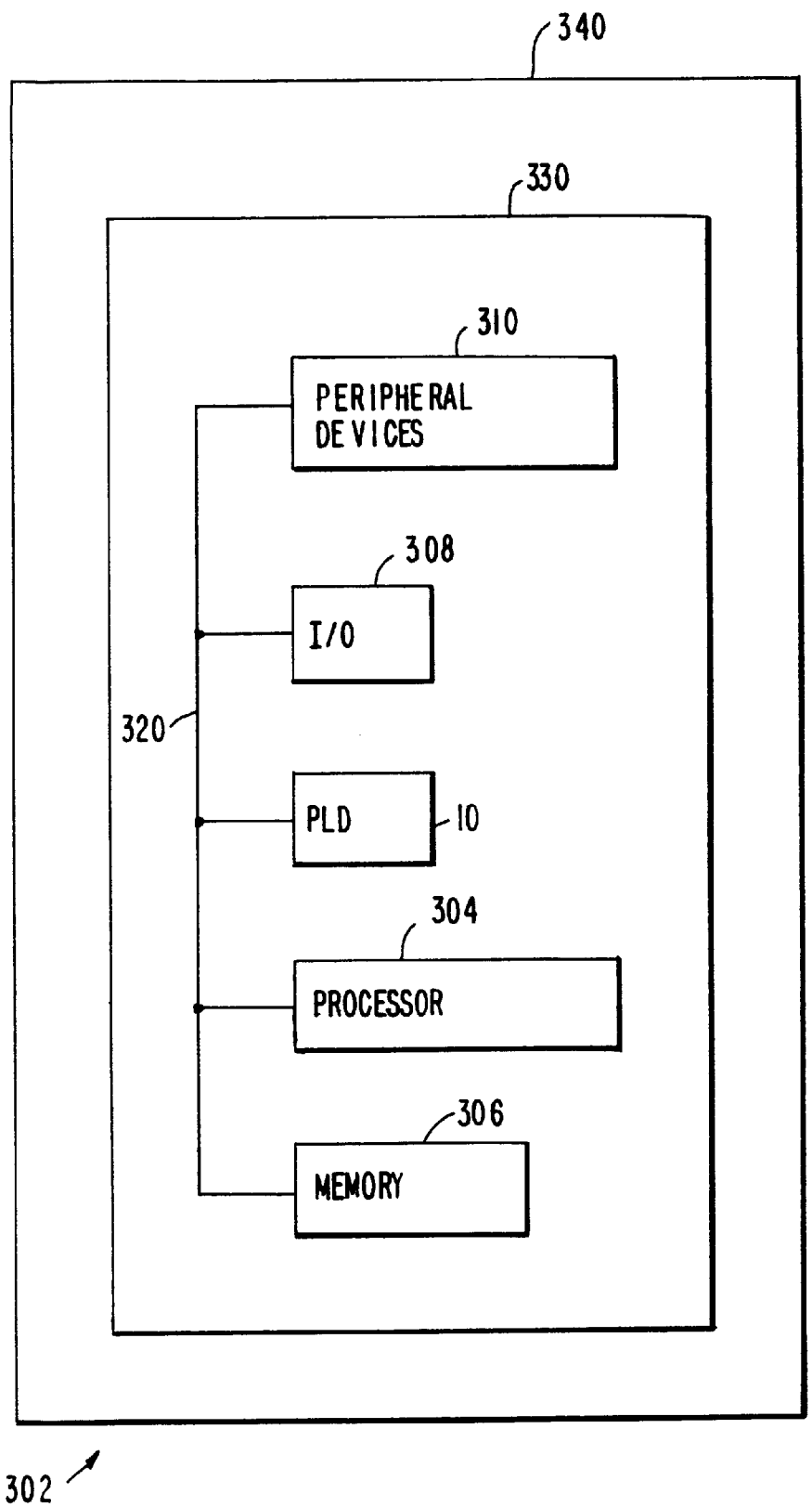
FIG. 10 is a simplified block diagram of an illustrative system employing a programmable logic device in accordance with the invention.

FIG. 10 illustrates a programmable logic device 10 of this invention in a data processing system 302. Data processing system 302 may include one or more of the following components: a processor 304; memory 306; I/O circuitry 308; and peripheral devices 310. These components are coupled together by a system bus 320 and are populated on a circuit board 330 which is contained in an end-user system 340.

System 302 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 304. Programmable logic device 10 may also be used as an arbiter for arbitrating access to a shared resource in system 302. In yet another example, programmable logic device 10 can be configured as an interface between processor 304 and one of the other components in system 302. It should be noted that system 302 is only exemplary, and that the true scope and spirit of the invention should be indicated by the following claims.

Various technologies can be used to implement programmable logic devices employing the super-regions, regions, and subregions of this invention, as well as the various components of those super-regions, regions, and subregions (e.g., the above-described PLCs and the programmable function control elements ("FCEs") which control the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SPAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of logic elements at each of the various levels in the hierarchy of logic elements can differ from the specific examples mentioned herein. Similarly, the numbers of the various types of interconnection conductors and other elements can deviate from the specific examples mentioned herein. It will also be understood that terms like "row" and "column", "horizontal" and "vertical", "left" and "right", "top" and "bottom", and other directional or orientational terms are used herein only for convenience, and that no fixed or absolute orientations are intended by the use of these terms. For example, the words in each of the word pairs mentioned above can be reversed if desired.

The invention claimed is:

1. A programmable logic integrated circuit device comprising:

a two-dimensional array of intersecting rows and columns of super-regions of programmable logic;

a plurality of horizontal inter-super-region interconnection conductors associated with each of said rows;

a plurality of vertical inter-super-region interconnection conductors associated with each of said columns;

each of said super-regions including a plurality of intersecting rows and columns of regions of programmable logic with horizontal and vertical inter-region interconnection conductors, wherein each of said regions includes a plurality of subregions of programmable logic that are programmable to perform any of a plurality of logic functions on input signals applied to said subregion to produce an output signal of said subregion;

programmable logic connectors associated with each of said super-regions for selectively interconnecting said inter-region interconnection conductors of said super-region to inter-super-region interconnection conductors associated with the row and column that include said super-region;

a plurality of local conductors associated with each of said regions for selectively bringing signals from said inter-region interconnection conductors into said region, the subregions in each region being disposed so that the local conductors associated with that region can extend adjacent to all of the subregions in that region by running substantially parallel to a first axis of said two-dimensional array;

subregion input conductors for selectively applying signals on said local conductors to the subregions associated with said local conductors as said input signals to the subregions by running substantially parallel to a second axis of said two-dimensional array that is substantially perpendicular to the first axis, routing through a local conductor and a subregion input conductor associated with a subregion being the sole routing available on said integrated circuit for applying a signal from any of said inter-region interconnection conductors to that subregion as one of said input signals; and subregion output conductors for selectively applying said output signal to one of said local conductors associated with said subregion by running substantially parallel to said second axis of said two-dimensional array, routing through a subregion output conductor associated with a subregion and a local conductor being the sole routing available on said integrated circuit for applying an output signal from said subregion to any of said inter-region interconnection conductors.

2. The device defined in claim 1 further comprising:
additional programmable logic connectors associated with each of said super-regions for selectively interconnecting horizontal and vertical inter-super-region conductors associated with the row and column that include said super-region.

3. The device defined in claim 1 wherein said programmable logic connectors include:
first programmable logic connectors for selectively interconnecting said horizontal inter-region interconnection conductors of said super-region to said horizontal inter-super-region interconnection conductors associated with the row that includes said super-region; and second programmable logic connectors for selectively interconnecting said vertical inter-region interconnection conductors of said super-region to said vertical inter-super-region interconnection conductors associated with the column that includes said super-region.

4. The device defined in claim 1 wherein, in each of said super-regions, each of said rows of regions has an associated plurality of said horizontal inter-region interconnection conductors and each of said columns of regions has an associated plurality of said vertical inter-region interconnection conductors.

5. The device defined in claim 1 wherein each of said super-regions further includes additional output programmable logic connectors for selectively applying signals on local conductors associated with each region to inter-region interconnection conductors of said super-region.

6. The device defined in claim 1 wherein each of said programmable logic connectors comprises:
an input stage for selecting one signal from a plurality of said conductors from which said programmable logic connector can provide an interconnection; and an output stage for applying said one signal to a selected one of a plurality of said conductors to which said programmable logic connector can provide an interconnection.

7. The device defined in claim 6 wherein each of said programmable logic connectors further comprises:
a driver for strengthening said one signal between said input stage and said output stage.

8. The device defined in claim 7 wherein said driver is a tri-state driver.

9. The device defined in claim 1 further comprising:
an input/output pad; and
an additional programmable logic connector for selectively interconnecting inter-super-region conductors of said device to said input/output pad.

10. The device defined in claim 9 wherein said additional programmable logic connector additionally selectively interconnects inter-region conductors of one of said super-regions to said input/output pad.

11. The device defined in claim 10 wherein said input/output pad is adjacent an end of a row of said super-regions, and wherein said additional programmable logic connector selectively interconnects horizontal inter-super-region interconnection conductors associated with said row and horizontal inter-region interconnection conductors of the super-region adjacent to said end of said row to said input/output pad.

12. The device defined in claim 10 wherein said input/output pad is adjacent an end of a column of said super-regions, and wherein said additional programmable logic connector selectively interconnects vertical inter-super-region interconnection conductors associated with said column and vertical inter-region interconnection conductors of the super-region adjacent to said end of said column to said input/output pad.

13. A digital processing system comprising:
processing circuitry;
memory circuitry coupled to said processing circuitry; and
a circuit as defined in claim 1 coupled to the processing circuitry and the memory circuitry.

14. A printed circuit board on which is mounted a circuit as defined in claim 1.

15. The printed circuit board defined in claim 14 further comprising:
memory circuitry mounted on the printed circuit board and coupled to the circuit.

16. The printed circuit board defined in claim 14 further comprising:
processing circuitry mounted on the printed circuit board and coupled to the circuit.

17. The device defined in claim 1 further comprising:
additional programmable logic connectors associated with each of said super-regions for selectively applying a signal from one of a plurality of said horizontal inter-super-region interconnection conductors to one of a plurality of said vertical inter-super-region interconnection conductors, and for selectively applying a signal from one of a plurality of said vertical inter-super-region interconnection conductors to one of a plurality of said horizontal inter-super-region interconnection conductors.

18. The device defined in claim 1 wherein each of said plurality of local conductors associated with a region includes segmented local conductors.

* * * * *